Figure 1:
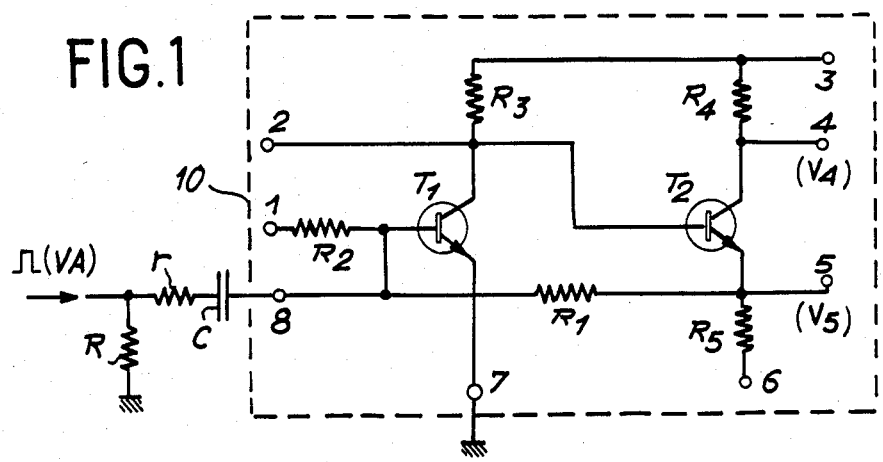

United States Patent [19]

Buisson et al.

[11] Patent Number: 4,507,620

[45] Date of Patent: Mar. 26, 1985

[54] ULTRA-RAPID HYBRID LINEAR AMPLIFIER

[75] Inventors: Jacques Buisson, Bures sur Yvette; Alain Loitière, Le Plessis Pate, both of France

[73] Assignee: Commissariat a l'Energie Atomigue, Paris, France

[21] Appl. No.: 268,739

[22] Filed: Jun. 1, 1981

[30] Foreign Application Priority Data

Jun. 4, 1980 [FR] France ................ 80 12395

[51] Int. Cl.³ .............................................. H03F 3/04
[52] U.S. Cl. ...................................... 330/307; 357/80
[58] Field of Search ........................... 330/307; 257/80

[56] References Cited

U.S. PATENT DOCUMENTS 3,142,021 7/1964 Stelmak ............................. 330/307
3,323,071 5/1967 Mitchell ............................. 330/307

OTHER PUBLICATIONS

Meindl et al., "How to Design Micropower Transistor Amplifiers: Part I", *Microelectronic Circuits and Applications*, pp. 271–276, McGraw-Hill, Copyright 1965.

Waldhauer, "Latest Approach to Integrated Amplifier Design", *Microelectronic Circuits and Applications*, pp. 98–101, McGraw-Hill, Copyright 1965.

*Primary Examiner*—James B. Mullins
*Attorney, Agent, or Firm*—Handal & Morofsky

[57] ABSTRACT

An ultra-rapid hybrid linear amplifier, comprising a microcircuit made according to hybrid technology having an ultra-rapid electric pulse rise time; this microcircuit constituted by two transistors and five resistors comprises a minimum metallization surface ensuring the different electrical links between the microcircuit and the eight pins of a box in which it is implanted, these links being ensured by conducting wires coming into contact with the metallization surface without contact with the substrate on which this microcircuit is made.

7 Claims, 3 Drawing Figures

ULTRA-RAPID HYBRID LINEAR AMPLIFIER

The present invention relates to an ultra-rapid hybrid linear amplifier.

More precisely, the present invention relates to a linear amplifier of which the rise time of the electric pulses, after amplification, is ultra-short. Such a linear amplifier may be used, in particular, in nuclear electronics where it is current to employ signal amplifiers as soon as they enter into different devices, such as for example in the devices relative to the safety of the reactors.

Known linear amplifiers, used in such devices, had such mediocre performances, both from the standpoint of the amplification gain and of the rise time of the electric pulses, reaching up to 20 nanoseconds, that manufacture thereof was totally suspended. Moreover, these circuits, made according to monolithic technology, were reserved for mass production, due to their cost.

It is precisely an object of the present invention to provide an ultra-rapid hybrid linear amplifier, which replaces these low-performance amplifiers and which has a pulse rise time which is much shorter than the rise time of these same amplifiers. Moreover, this linear amplifier is made according to hybrid technology.

According to the invention, this linear amplifier comprises an electronic microcircuit made according to hybrid technology, having a very wide pass band and an ultra-rapid rise of the electric pulses, this microcircuit comprising a minimum metallization circuit ensuring an electrical link on the one hand between the different components of said microcircuit and on the other hand between the different electrical inputs and outputs of the amplifier and the pins of a box in which said amplifier is implanted, this link being ensured solely by conducting wires coming into contact with the metallization surface, without any contact with the substrate.

According to an essential feature of the invention, this microcircuit has an electric pulse rise time shorter than 5 nano-seconds.

According to a preferred embodiment of the invention, the resistors of said microcircuit have a width of about 50µ for a square resistance of 100 ohms and the transistors, made according to monolithic technology, are added by adhesion so that said microcircuit, made according to hybrid technology, has dimensions similar to those which would be obtained with an integrated circuit made according to monolithic technology.

This linear amplifier offers a certain number of advantages and, in particular, an ultra-short pulse rise time, which is indispensable for the development and maintenance of nuclear equipment, as well as dimensions close to those obtained according to monolithic technology. The fact of having made this linear amplifier according to hybrid technology enables it to be manufactured much more quickly and at a lower cost than if it had been made according to monolithic technology.

Figure 2:
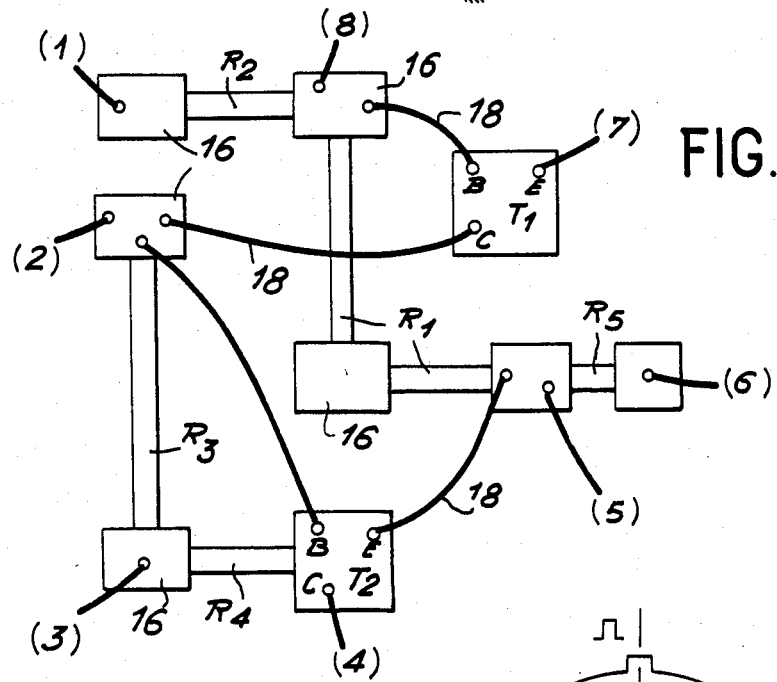
Figure 3:
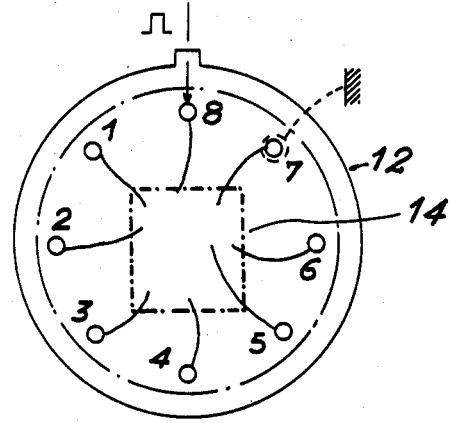

The invention will be more readily understood on reading the following description with reference to the accompanying drawings, in which:

FIG. 1 schematically shows the electric circuit of the linear amplifier according to the invention, FIG. 2 shows a diagram of implantation according to hybrid technology of the electric circuit of FIG. 1, FIG. 3 schematically shows the implantation of the electric circuit of FIG. 2 in an eight-pin box.

Referring now to the drawings, FIG. 1 represents the microcircuit composing the linear amplifier. This microcircuit 10 shown in a broken-line frame, comprises two transistors $T_1$ and $T_2$, for example of the npn type (2N3570) and five resistors $R_1, R_2, R_3, R_4$ and $R_5$ connected together and to the pins of the box 12 (FIG. 3) in which this microcircuit 10 is implanted, so that:

the base of the transistor $T_1$ is connected on the one hand to the emitter of the transistor $T_2$ via a resistor $R_1$ and on the other hand to a first pin 1 of the box 12 via a resistor $R_2$;

the collector of the transistor $T_1$ is connected on the one hand directly to the base of the transistor $T_2$, on the other hand directly to a second pin 2 of the box 12, and also to a third pin 3 of the box 12 via a resistor $R_3$;

the collector of the transistor $T_2$ is connected to the third pin 3 of the box 12 via a resistor $R_4$, and directly to a fourth pin 4 of the box 12;

the emitter of transistor $T_2$ is, moreover, connected directly to a fifth pin 5 of the box 12 and to a sixth pin 6 of the box 12 via a resistor $R_5$, the emitter of the transistor $T_1$ is connected directly to a seventh pin 7 of the box 12 itself connected to the bottom of the box and representing earth;

the base of the transistor $T_1$ is connected, moreover, directly to an eighth pin 8 of the box 12 corresponding to the input of the electric pulses (noted $\Omega$) in the microcircuit 10.

This circuit receives current at pin 8 of the box 12, shown schematically in FIG. 3, by pulses delivered by a generator (not shown) and supplying a resistor r and a capacitor C placed in series.

As this hybrid linear amplifier, or microcircuit 10 must replace the amplifiers of the prior art in a well defined chain of electronic circuits, the resistor r as well as the input voltage of the electric pulses $V_A$ and the output voltages referenced $V_4$ and $V_5$ of the microcircuit and having well defined values, involve certain conditions as to the resistance value of the resistors $R_1$, $R_4$ and $R_5$.

These conditions are such that:

$(V_5/V_A) = 2$ therefore $R_1 = 2r$ $(V_4/V_A) = 2 \times (R_4/R_5) = 8.66$ therefore $R_4 = 4.33 R_5$ this value (8.66) being a function of the gain of the amplifier between the input voltage $V_A$ and the non-charged output voltage $V_5$. As r has an imposed value of 1 k$\Omega$, $R_1$ has a resistance value of 2$\Omega$ and if $R_5$ has a resistance value of 120$\Omega$, $R_4$ is 520$\Omega$.

To obtain good performances from the microcircuit 10 (high gain and ultra-short rise time) $R_1$ as well as the ratio $R_4/R_5$ must have a precision of more or less 5%.

On the other hand, the other resistors $R_2$ and $R_3$ may be defined with a precision of more or less 20%. The resistor $R_2$ has a resistance value of about 520$\Omega$ and resistor $R_3$ about 2.7 k$\Omega$.

The amplifier thus produced has a wide pass band (of the order of 60 MHz), this giving it a pulse rise time shorter than 5 nanoseconds.

FIGS. 2 and 3 show the implantation of the microcircuit described hereinabove, in a box 12 with eight pins, referenced from 1 to 8, of TO5 type. The microcircuit 10 is made according to the technology of hybridization.

On an insulating substrate 14 made of glass or ceramics are deposited the conducting metal layers 16 and the resistive layers. The resistive layers are preferably made either of nickel-chromium (NiCr) or of tantalum nitride (Ta$_2$N).

The microcircuit 10 is made by chemical photogravure with different steps of masking and chemical attack according to the usual techniques used in hybrid microelectronics which will not be described here.

Once this has been done, the two transistors T$_1$ and T$_2$ made according to monolithic technology may be welded or glued, then the conducting wires 18, preferably made of aluminium, are welded by ultrasonic welding due to the small metallization surface 16. This minimum metallization 16 enables the parasitic capacities due to the metallisation to be decreased, this making it possible to obtain a linear amplifier having an ultra-short pulse rise time. In fact, the pulse rise time is less than 5 nanoseconds.

The dimensions of this hybrid microcircuit 10 defined by the linear amplifiers according to monolithic technology implies that the hybrid microcircuit 10 has dimensions close to those which would be obtained according to monolithic technology; this represents a considerable performance since, up to the present time, a microcircuit according to hybrid technology was at least twenty times greater then this same microcircuit made according to monolithic technology. This performance comes not only from the size of the resistors having a width of 50$\mu$ for a square resistance of 100$\Omega$, but also from the metallization 16 reduced to its most simple expression. The conducting wires 18 connecting the microcircuit 10 to the eight pins of the box 12 come directly into contact inside said box 12 with the metallization surfaces.

The electric microcircuit 10 is made on a substrate 14 with sides measuring 3.4 mm, whilst the eight pins of the box are implanted over a diameter of 5.84 mm.

Moreover, as the link between the different components of the microcircuit is produced by conducting wires 18, the metallization surfaces 16 is further minimized; these conducting wires 18, made of aluminium and of dimensions smaller than those which would exist for a corresponding metallization, have much weaker parasitic capacities. The existence of an insulating substrate 14, and the fact that the conducting wires have no contact with said substrate do not create parasitic capacities likely to decelerate the pulse rise time.

It should be noted that, in this implantation, the resistor R$_1$ is made in two parts placed at 90° with respect to each other, but that the shape of this resistor, as well as the shape of the other resistors, may be different.

This hybrid microcircuit used in nuclear electronics is intended for functioning in the laboratory in boxes fitting out measuring instruments. Tbhis microcircuit is therefore not subjected to any thermal, mechanical or climatic stress, this ensuring the electrical links between the different components of said circuit and the pins of the box solely by conducting wires.

In the above description, the case has been envisaged of an implantation in an eight-pin box of a hybrid circuit, but, of course, the implantation of a different hybrid microcircuit in a box having more or less than 8 pins may be envisaged.

What is claimed is:

1. An ultra-rapid linear amplifier comprising an electronic microcircuit incorporating deposited resistors and active elements supported on an insulative substrate, having a very wide pass band and an ultra-rapid pulse rise time, said microcircuit comprising conducting metal layers deposited on said substrate and having a minimum metallization surface having a size with the same order of magnitude as the size of said active elements for providing connection to an electrical link between the different components of said microcircuit and the different electrical input and output points of the amplifier and the pins of a box in which said amplifier is implanted, said points being provided solely by conducting wires coming into contact with the metallization surface without any contact with the substrate.

2. The linear amplifier of claim 1, wherein electrical contact with said metallization surface is made by an ultrasonic weld.

3. The linear amplifier of claim 1, wherein the microcircuit comprises two transistors of the npn type and five resistors, said transistors and resistors being connected together so that:
    (a) the base of the first transistor is connected to the emitter of the second transistor via a first resistor and to a first pin of the box via a second resistor;
    (b) the collector of the first transistor is connected directly to a second pin of the box and also to a third pin of the box via a third resistor;
    (c) the collector of the second transistor is connected to said third pin of the box via a fourth resistor and directly to a fourth pin of the box;
    (d) the emitter of the second transistor is connected directly to a fifth pin of the box and to a sixth pin of the box via a fifth resistor;
    (e) the emitter of the first transistor is connected directly to a seventh pin of the box itself connected to the bottom of the box and corresponding to ground; and
    (f) the base of the first transistor is connected, moreover, to an eighth pin of the box corresponding to the input of the electric pulses to the microcircuit.

4. The linear amplifier of claim 1, 3 or 2, wherein the resistors of the microcircuit have a width of about 50$\mu$ for a square resistance of 100 ohms and the transistors are made according to monolithic technology so that said microcircuit made according to hybrid technology has dimensions close to those which would be obtained with an integrated circuit manufactured according to monolithic technology.

5. The linear amplifier of claim 1, 3 or 2, wherein the substrate is made of an insulating material chosen from the group comprising glass and ceramics.

6. The linear amplifier of claim 1, 3 or 2, wherein the conducting wires are made of aluminium.

7. The linear amplifier of claim 1, 3 or 2, wherein the resistors are made of a material chosen from the group comprising tantalum nitride and nickel-chromium.

* * * * *